(12) United States Patent
Zhang et al.

(10) Patent No.: US 9,036,836 B2
(45) Date of Patent: May 19, 2015

(54) AMPLIFIER APPARATUS

(75) Inventors: Mingxue Zhang, Kanagawa (JP); Seigo Ozaki, Kanagawa (JP); Tsuyoshi Haga, Kanagawa (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 293 days.

(21) Appl. No.: 13/701,554

(22) PCT Filed: Jun. 16, 2011

(86) PCT No.: PCT/JP2011/003435
§ 371 (c)(1),
(2), (4) Date: Dec. 3, 2012

(87) PCT Pub. No.: WO2011/161911
PCT Pub. Date: Dec. 29, 2011

(65) Prior Publication Data
US 2013/0077806 A1    Mar. 28, 2013

(30) Foreign Application Priority Data

Jun. 25, 2010  (JP) .................................. 2010-144647
Mar. 29, 2011  (JP) .................................. 2011-071471

(51) Int. Cl.
*H03F 99/00* (2009.01)
*H03F 3/38* (2006.01)
(Continued)

(52) U.S. Cl.
CPC ................ *H03F 3/20* (2013.01); *H03F 3/2173* (2013.01)

(58) Field of Classification Search
None
See application file for complete search history.

(56) References Cited

U.S. PATENT DOCUMENTS 8,093,951 B1 *   1/2012   Zhang et al. ................. 330/251
2004/0066229 A1 *   4/2004   Taura et al. .................. 330/10
(Continued)

FOREIGN PATENT DOCUMENTS

JP   02-164113 A   6/1990
JP   2000-059153 A   2/2000
(Continued)

OTHER PUBLICATIONS

International Search Report for PCT/JP2011/003435 dated Aug. 2, 2011.
(Continued)

*Primary Examiner* — Thang Tran
(74) *Attorney, Agent, or Firm* — Pearne & Gordon LLP

(57) ABSTRACT

Disclosed is a technique for reducing noise superimposed on an output signal while keeping loop gain constant without increasing the circuit scale and without changing the transfer function of the amplifier apparatus (frequency characteristics of gain and phase). According to the technique, there are included a power-supply voltage control unit 7 for detecting the amplitude level S9 of an input audio signal S1 and outputting power with a voltage value indicated by target set voltage value information Vs corresponding to this amplitude level S9, and a PWM modulation unit 2 including a PWM converter 23 for converting the pulse width of the input audio signal S1 and a correction unit for correcting the signal modulated by the PWM converter 23. The PWM modulation unit 2 corrects the pulse width of a PWM signal S5 modulated by the PWM converter 23 so that the correction unit will cancel out a change in amplification gain of a power amplification unit 4 according to the target set voltage value information Vs.

6 Claims, 8 Drawing Sheets

(51) Int. Cl.
*H03F 3/20* (2006.01)
*H03F 3/217* (2006.01)

(56) References Cited

U.S. PATENT DOCUMENTS

| | | |
|---|---|---|
| 2005/0168204 A1 | 8/2005 | Nielsen et al. |
| 2006/0006933 A1* | 1/2006 | Nguyen ............... 330/10 |
| 2006/0015199 A1 | 1/2006 | Ebi et al. |
| 2006/0077005 A1* | 4/2006 | Lee et al. ............ 330/10 |
| 2006/0132231 A1 | 6/2006 | Ishii et al. |
| 2007/0063764 A1* | 3/2007 | Nadd ................. 330/10 |
| 2007/0109044 A1 | 5/2007 | Nielsen et al. |
| 2008/0003959 A1* | 1/2008 | Lee et al. ............ 455/127.1 |
| 2008/0024210 A1* | 1/2008 | Park ................. 330/10 |
| 2009/0289709 A1 | 11/2009 | Khoury et al. |
| 2010/0321116 A1* | 12/2010 | Kim et al. ........... 330/297 |
| 2013/0108081 A1* | 5/2013 | Ozaki et al. ......... 381/121 |

FOREIGN PATENT DOCUMENTS

| | | |
|---|---|---|
| JP | 2004-180294 A | 6/2004 |
| JP | 2007-110646 A | 4/2007 |
| WO | 98/44626 A2 | 10/1998 |

OTHER PUBLICATIONS

Extended European Search Report for Application No. 11797800.7 dated Nov. 14, 2014.

* cited by examiner

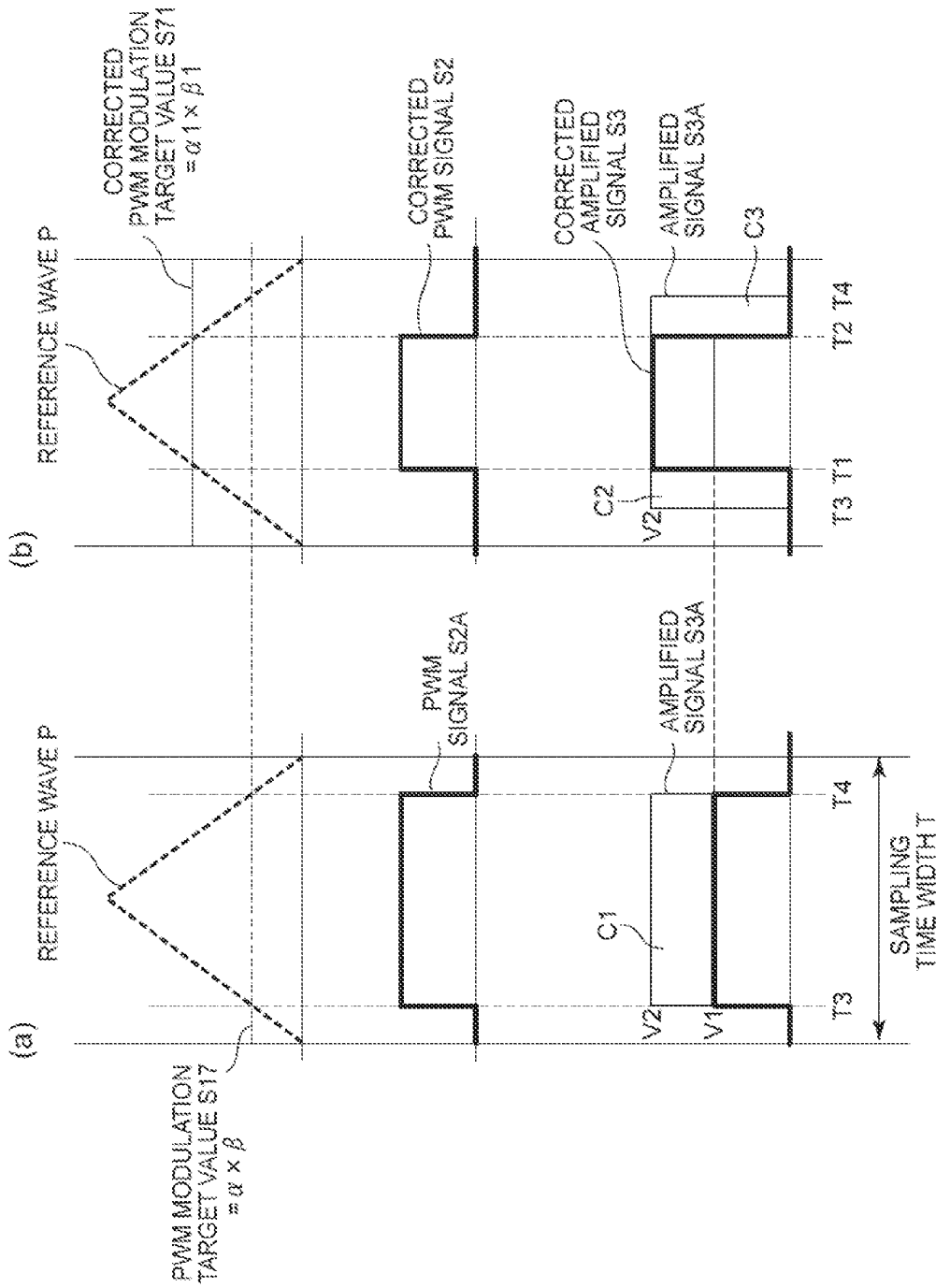

AMPLIFIER APPARATUS

TECHNICAL FIELD

The present invention relates to an amplifier apparatus for amplifying the power of an input signal, and particularly to an amplifier apparatus for controlling the voltage of a power supply at a power amplifier stage to improve the S/N ratio of an output signal and power efficiency at the power amplifier stage.

BACKGROUND ART

Conventionally, there has been a technique for using a voltage-variable power supply as the power supply of an amplifier apparatus to make it follow the level of an input audio signal to the amplifier apparatus in order to increase or decrease the value of power supply voltage to be supplied to a power amplifier stage, thereby reducing noise superimposed on an output signal and improving the power efficiency at the power amplifier stage. In this case, the power supply voltage to be supplied to the power amplifier stage is made to follow the level of the input audio signal. Therefore, when the level of the input audio signal is low, since the power supply voltage at the power amplifier stage can be reduced to a voltage value with an amplitude that does not distort the amplified signal, noise superimposed on the output signal of the amplifier apparatus can be reduced and power efficiency at the power amplifier stage can be improved.

However, when the power supply voltage to be supplied to the power amplifier stage is lowered, the amplification gain of the amplifier apparatus due to voltage amplification at the power amplifier stage also drops. To prevent this, there is known a technique in which a constant voltage control circuit controls the voltage of a power amplification unit in proportion to the amplitude level of an input analog signal, and an attenuator provided in a feedback circuit cooperates with the constant voltage control circuit to adjust a feedback amount to be kept constant according to the voltage level of a constant voltage (for example, see Patent document 1 cited below). There is also known another conventional technique in which the gain of gain adjustment means provided in a feedback loop is adjusted according to an increase or decrease in voltage value to be supplied to a switching amplifier in a signal reproducing apparatus (for example, see Patent document 2 cited below).

PRIOR ART DOCUMENTS

Patent Documents

Patent document 1: Japanese Patent Application Publication No. 2000-059153 (Abstract)
Patent document 2: Japanese Patent Application Publication No. 2007-110646 (Abstract)

However, there are the following problems in the conventional amplifier apparatuses, namely: The technique disclosed in Patent Document 1 is configured to change the amount of attenuation in the feedback circuit according to the voltage level of the constant voltage to be applied to a switching amplifier in order to keep loop gain constant. Therefore, there is a need to make the amount of attenuation on the feedback circuit variable. When this amount of attenuation is changed steplessly or in a multistep manner, an electronic attenuation circuit or the like is required, resulting in an increase in circuit size. There is also a problem that noise is generated upon switching from an amount of change to another. Next, the technique disclosed in Patent Document 2 can keep the negative feedback loop gain unchanged, but it causes a problem that the transfer function changes.

SUMMARY OF THE INVENTION

In view of the above problems in the conventional techniques, it is an object of the present invention to provide an amplifier apparatus capable of reducing noise superimposed on an output signal while keeping loop gain constant without increasing the circuit size and without changing the transfer function of the amplifier apparatus (frequency characteristics of gain and phase), and capable of improving the S/N ratio especially in the case of a small input audio signal.

In order to achieve the above object, an amplifier apparatus of the present invention includes: power amplification means for amplifying a power of an input audio signal by switching a power supply voltage using a pulse width modulation signal appropriate for the level of the input audio signal; power-supply voltage control means for detecting the amplitude level of the input audio signal and applying a target set voltage appropriate for the detected amplitude level of the input signal to the power amplification means as the power supply voltage; means for monitoring output of the power amplification means; pulse width conversion means for converting the input audio signal to a pulse width modulation signal with a pulse width appropriate for the level; and pulse width correction means for correcting the pulse width of the pulse width modulation signal generated by the pulse width conversion means based on the target set voltage and the monitored output of the power amplification means to cancel out a change in amplification gain of the power amplification means, and applying the corrected pulse width modulation signal to the power amplification means.

Further, in order to achieve the above object, an amplifier apparatus of the present invention includes: power amplification means for amplifying a power of an input audio signal by switching a power supply voltage using a pulse width modulation signal appropriate for the level of the input audio signal; power-supply voltage control means for detecting the amplitude level of the input audio signal and applying a target set voltage appropriate for the detected amplitude level of the input signal to the power amplification unit as the power supply voltage; detection means for detecting the power supply voltage to be applied to the power amplification means; pulse width conversion means for converting the input audio signal to a pulse width modulation signal with a pulse width appropriate for the level; a basic clock generating unit for generating a basic clock as a basic timing signal upon conversion of the input audio signal to the pulse width modulation signal; a ramp slope control unit for generating a ramp wave different in slope according to the detected power supply voltage from the basic clock generated by the basic clock generating unit; means for monitoring output of the power amplification means; and a correction unit for correcting the pulse width of the pulse width modulation signal generated by the pulse width conversion means based on the ramp wave generated by the ramp slope control unit and the monitored output of the power amplification means to cancel out a change in amplification gain of the power amplification means, and applying the corrected pulse width modulation signal to the power amplification means.

According to the present invention, noise superimposed on an output signal can be reduced while keeping loop gain constant without increasing the circuit size and without changing the transfer function (frequency characteristics of gain and phase) of the amplifier apparatus, and capable of improving the S/N ratio especially in the case of a small input audio signal.

BRIEF DESCRIPTION OF THE DRAWINGS

FIG. 8 It contains explanatory charts for describing the principle of controlling the PWM modulation target value of the PWM converter to cancel out a change in amplification gain due to variations in voltage values of the source power of the power amplification unit in Embodiment 3 of the present invention.

DESCRIPTION OF EMBODIMENTS

Embodiment 1

An amplifier apparatus 1 according to Embodiment 1 of the present invention will now be described with reference to a block diagram of FIG. 1.

Figure 1:
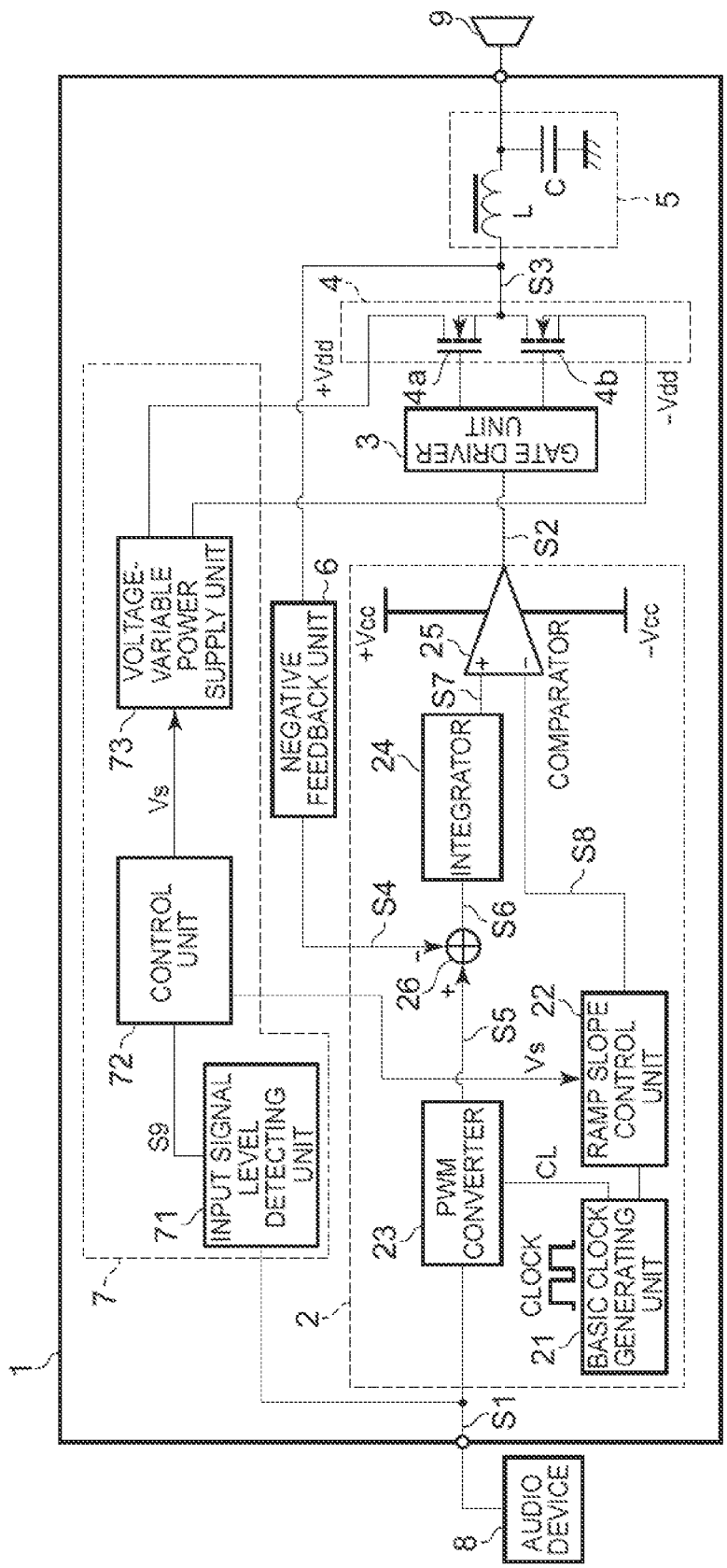
FIG. 1 It is a block diagram of an amplifier apparatus according to Embodiment 1 of the present invention.

In FIG. 1, the amplifier apparatus 1 in this Embodiment 1 is connected to an audio device 8 from which audio signals are output at line level.

An audio signal output from the audio device 8 is input into the amplifier apparatus 1 as an input audio signal S1 of the amplifier apparatus 1, subjected to power amplification in the amplifier apparatus 1, and output to a speaker 9. The speaker 9 converts, to sound, the audio signal output from the amplifier apparatus 1 after being subjected to power amplification, and emits the sound.

Further, the amplifier apparatus 1 and the audio device 8 are connected to a DC power supply (not shown) for supplying power required to activate them. Note that the power supply required to activate each apparatus/device is not limited to the DC power supply, and an AC power supply may also be used arbitrarily according to the characteristics of each apparatus/device.

The amplifier apparatus 1 is configured to include a PWM (Pulse Width Modulation) modulation unit 2, a gate driver unit 3, a power amplification unit 4, a lowpass filter 5, a negative feedback unit 6, and a power-supply voltage control unit 7. Particularly, the negative feedback unit 6 is provided in the amplifier apparatus 1 to negatively feed an output signal of the power amplification unit 4 back to the PWM modulation unit 2.

When the audio signal S1 is input from the audio device 8 to the amplifier apparatus 1, the input audio signal S1 is input into the power-supply voltage control unit 7 and the PWM modulation unit 2.

The power-supply voltage control unit 7 detects an amplitude level (S9) of the input audio signal S1 input from the audio device 8, and outputs, to the PWM modulation unit 2, target set voltage value information Vs (the details of which will be described later) corresponding to the detected amplitude level (S9) of the input audio signal S1. The power-supply voltage control unit 7 also controls positive-side and negative-side output voltages (+Vdd, −Vdd) to set target voltages as voltage values indicated by the target set voltage value information Vs, and sends the power amplification unit 4 the source power of the power supply as the positive-side and negative-side voltage values (+Vdd, −Vdd).

The PWM modulation unit 2 converts the input audio signal S1 input from the audio device 8 into a PWM signal S5 with a pulse width appropriate for the input audio signal S1. Then, using a feedback signal S4 input from the negative feedback unit 6 and the target set voltage value information Vs input from the power-supply voltage control unit 7, the PWM modulation unit 2 corrects the pulse width of the PWM signal S5 (the details of which will be described later), and sends the gate driver unit 3 the obtained signal as a corrected PWM signal S2.

Here, the PWM modulation unit 2 can be implemented by a digital signal processor, a micro-controller, or the like.

The gate driver unit 3 inserts a dead-time into the corrected input PWM signal S2, creates a drive signal obtained by shifting the potential of the corrected PWM signal S2 to such a degree that the high-side (+Vdd) and low-side (−Vdd) high-speed switching elements 4a and 4b in the power amplification unit 4 can be driven, and sends the drive signal to the power amplification unit 4.

The power amplification unit 4 is configured as a half-bridge circuit consisting of the high-side high-speed switching element 4a arranged on a high-potential power supply side and supplied with the positive-side voltage +Vdd from the power-supply voltage control unit 7, and the low-side high-speed switching element 4b arranged on a low-potential power supply (or grounded) side and supplied with the negative-side voltage −Vdd from the power-supply voltage control unit 7.

The power amplification unit 4 performs a high-speed switching operation with a voltage swing decided by the drive signal input from the gate driver unit 3 on the positive-side voltage +Vdd and the negative-side voltage −Vdd so that the signal input into the power amplification unit 4 will be subjected to power amplification to obtain a corrected amplified signal S3.

The corrected amplified signal S3 obtained is output to the negative feedback unit 6 and sent to the lowpass filter 5. Here, as the high-speed switching elements 4a and 4b, for example, MOS field-effect transistors or the like are used.

The negative feedback unit 6 is provided on a feedback circuit to attenuate the corrected amplified signal S3 output from the power amplification unit 4 to negatively feed it back to the PWM modulation unit 2 as the feedback signal S4.

The lowpass filter 5 is a filter for outputting, to the speaker 9, an audio signal obtained by removing unnecessary high-frequency components from the corrected amplified signal S3 output from the power amplification unit 4. For example, the lowpass filter 5 is composed of elements such as a coil L and a capacitor C.

The detailed internal structure and operation of the power-supply voltage control unit 7 and the PWM modulation unit 2 will be described with reference to the block diagram of FIG. 1.

The power-supply voltage control unit 7 is configured to include an input signal level detecting unit 71, a control unit 72, and a voltage-variable power supply unit 73.

The input signal level detecting unit 71 creates input signal amplitude level information S9 including amplitude information on the input audio signal S1 input from the audio device 8, and sends it to the control unit 72.

The control unit 72 selects, from data table information preset in the control unit 72, target set voltage value information Vs corresponding to the input signal amplitude level information S9 created in the input signal level detecting unit 71, and outputs the selected target set voltage value information Vs not only to the voltage-variable power supply unit 73 but also to the PWM modulation unit 2.

The target set voltage value information Vs is information indicative of target values for voltage values (+Vdd, −Vdd) to be set for the voltage-variable power supply unit 73.

The voltage-variable power supply unit 73 is a power supply for varying the output voltages (+Vdd, −Vdd) to voltage values to be set according to the target set voltage value information Vs input from the control unit 72, and supplying, to the power amplification unit 4, source power with the voltage values (+Vdd, −Vdd) controlled based on the target set voltage value information Vs.

The input signal level detecting unit 71 and the control unit 72 can be implemented by digital signal processors, microcontrollers, or the like.

Next, the PWM modulation unit 2 is configured to include a PWM converter 23, a basic clock generating unit 21 as a PWM pulse width correction unit, a ramp slope control unit 22, an integrator 24, a comparator 25, and an adder 26. ±Vcc are supplied as the power supply voltages to each of the above components of the PWM modulation unit 2.

Here, the PWM converter 23 is a processing unit for determining a PWM signal by means of an arithmetic circuit for carrying out operations mostly digitally. The PWM modulation unit 2 is a block as a modulation circuit including a correction unit, a comparator, or the like in addition to the converter 23.

Figure 2:
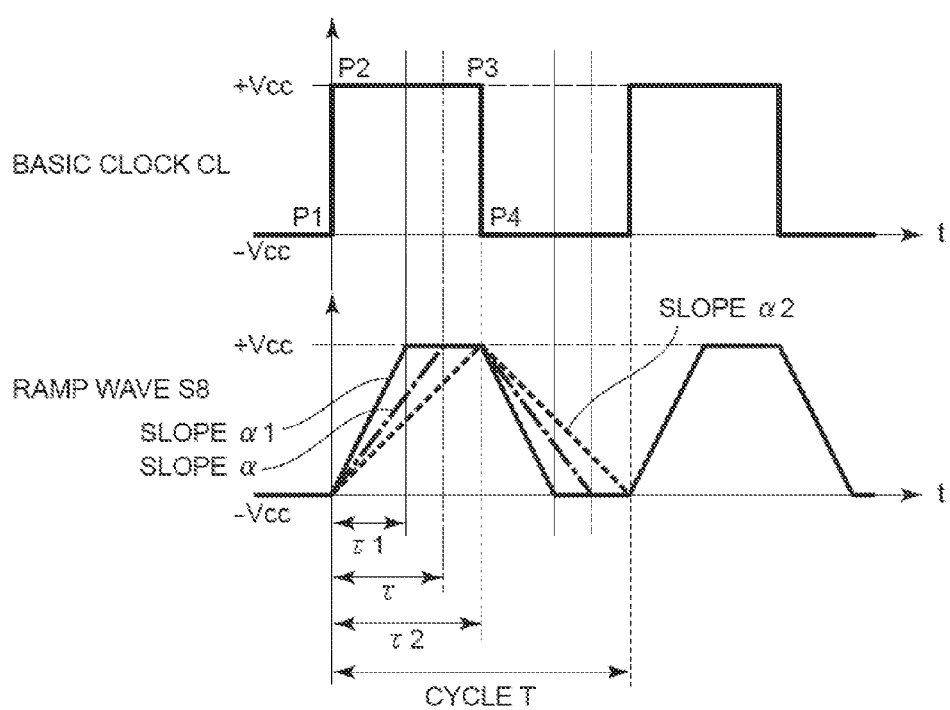
FIG. 2 It is a chart showing a relationship between the slope of a ramp wave and the rising time in Embodiment 1 of the present invention.

As shown in FIG. 2, the basic clock generating unit 21 generates a basic clock CL as a timing signal when the PWM converter 23 make a PWM conversion of the input audio signal S1, which has a predetermined cycle T and whose voltage swing level is ±Vcc(V). Here, the basic clock CL is a square wave having a cycle sufficiently shorter than the cycle of the input audio signal S1 input from the audio device 8.

The generated basic clock CL is output not only to the PWM converter 23 but also to the ramp slope control unit 22.

The PWM converter 23 uses the basic clock CL input from the basic clock generating unit 21 to make a conversion to the PWM signal S5 with a pulse width appropriate for the input audio signal S1 input from the audio device 8 and output it to the adder 26. As PWM conversion methods, there are known a delta-sigma conversion method and a triangular wave comparison method. In this embodiment, either of the methods is applied.

The adder 26 uses the PWM signal S5 input from the PWM converter 23 and the feedback signal S4 input from the negative feedback unit 6. More specifically, it subtracts the feedback signal S4 from the PWM signal S5 to create a differential signal S6 (=S5−S4) including an error component between the PWM signal S5 and the feedback signal S4 and output it to the integrator 24.

The integrator 24 integrates the differential signal S6 input from the adder 26 to create a differential integral signal S7 including the above-mentioned error component and output it to a plus (+) input terminal of the comparator 25.

As shown in FIG. 2, the ramp slope control unit 22 uses the basic clock CL input from the basic clock generating unit 21 and the target set voltage value information Vs input from the control unit 72 to create a ramp wave S8 with a slope α (the details of which will be described later), and output it to a minus input terminal of the comparator 25.

The comparator 25 compares the differential integral signal S7 input from the integrator 24 with the ramp wave S8 input from the ramp slope control unit 22, creates the corrected PWM signal S2 including the above-mentioned error component (=S5−S4) and represented as the cycle T of the ramp wave S8, and sends it to the gate driver unit 3.

Here, the definition of the slope α of the ramp wave S8 and the details of the principle of controlling the ramp slope α to cancel out a change in amplification gain due to variations in the voltage values (+Vdd, −Vdd) of the source power of the power amplification unit 4 will be described with reference to FIG. 2 and FIG. 3.

First, the definition of the slope α of the ramp wave S8 used in this Embodiment 1 will be described with reference to FIG. 2.

As shown in FIG. 2, the ramp wave S8 is a signal that rises in synchronization with the rising edge P1-P2 of the basic clock CL and falls in synchronization with the falling edge P3-P4. Further, the rising and falling slopes (α, −α) of the ramp wave S8 are slopes defined by a predetermined time width, respectively.

Then, the voltage swing of the ramp wave S8 is ±Vcc(V) identical to that of the basic clock CL, the rising and falling time widths τ of the ramp wave S8 have the same time widths as each other.

Here, relationships among the target voltage ±Vt(V) corresponding to the target set voltage value information Vs, the time width τ, and the slope α of the ramp wave S8 are defined respectively as follows:

First, it is assumed that the target voltage value ±Vt(V) is ±Vdd(V) when the maximum amplitude level of the input audio signal S1max from the audio device 8 is input into the amplifier apparatus 1, the target set voltage value information Vs is Vsmax, the time width τ of the slope of the ramp wave S8 is τ1, and the slope α of the ramp wave S8 is α1. The maximum amplitude level (S1max) indicates a case where the voltage values ±Vdd(V) as the maximum power of the source power are supplied to the power amplification unit 4, meaning an amplitude level of the input audio signal S1 to enable amplification without distortion due to the voltage values ±Vdd of the source power.

When the control unit 72 outputs target set voltage value information (in this case, Vsmax) to the voltage-variable power supply unit 73 and the ramp slope control unit, the voltage-variable power supply unit 73 supplies, to the power amplification unit 4, the target voltage values ±Vdd(V) as the voltage values of the maximum source power based on the target set voltage value information Vsmax.

Then, the ramp slope control unit 22 creates a ramp wave S8 for which the time width τ of the slope α of the ramp wave S8 corresponding to the target set voltage value information Vsmax is set as follows:

$$1/m \times T (2 < m)$$

(the thick solid line shown in FIG. 2). The slope of the ramp wave in this case is set to α1 to assume the following:

$$\alpha 1 = 2|Vcc|/\tau 1.$$

Further, it is defined that the target voltage value ±Vt(V) when the minimum amplitude level of the input audio signal S1min from the audio device 8 is input into the amplifier apparatus 1 is $$\pm 2/n1 \times Vdd(V) \text{ (where } 2 < n1),$$

the target set voltage value information Vs is Vsmin, the time width τ of the slope of the ramp wave is τ2, and the slope α of the ramp wave S8 is α2. The minimum amplitude level (S1min) is an amplitude level of the input audio signal S1 when the voltage value ±2/n1×Vdd(V) of the minimum source power is supplied to the power amplification unit 4.

Like in the case where the maximum amplitude level of the input audio signal S1max is input, when the control unit 72 outputs target set voltage value information (in this case, Vsmin) to the voltage-variable power supply unit 73 and the ramp slope control unit 22, the voltage-variable power supply unit 73 supplies, to the power amplification unit 4, the target voltage values ±2/n1×Vdd(V) as the voltage values of the minimum source power based on the target set voltage value information Vsmin.

Then, the ramp slope control unit 22 creates a ramp wave S8 for which the time width τ2 corresponding to the target set voltage value information Vsmin is set to ½×T (the thick broken like shown in FIG. 2). The slope α2 of the ramp wave S8 in this case is set as follow:

$$\alpha 2 = 2|Vcc|/\tau 2.$$

The threshold values of the target voltage values ±Vt(V) corresponding to target set voltage value information Vs when the maximum amplitude level and the minimum amplitude level of the input audio signals S1max and S1min from the audio device 8 are input into the amplifier apparatus 1, the time width τ and the slope α of the ramp wave S8 are defined as mentioned above. In this case, when an arbitrary amplitude level of the input audio signal S1 is input into the amplifier apparatus 1, the target set voltage value information Vs falls within a range of Vsmax to Vsmin, and the target voltage values ±Vt(V) supplied from the voltage-variable power supply unit 73 to the power amplification unit 4 as the voltage values of the source power falls within a range of ±Vdd(V) to ±2/n1×Vdd(V).

Based on the variable range of Vsmax to Vsmin, the ramp slope control unit 22 creates a ramp wave S8 with the time width τ controlled within the range of τ1 to τ2 (the thick dashed-dotted line shown in FIG. 2). The slope α of the ramp wave S8 in this case falls within a range of α1 to α2.

From the above-mentioned content, it is found that the time width τ bears an inverse relation to the target voltage values ±Vt(V) corresponding to the target set voltage value information Vs. In other words, the relationship between time width τ and target set voltage value information V is expressed by Equation 1.

$$\tau = K0 \times (1/|Vt|) \qquad \text{Eq. 1}$$

If the definition of the target voltage values ±Vt=±Vdd(V) corresponding to the target set voltage value information Vsmax when the maximum amplitude level of the input audio signal S1max is input from the audio device 8 into the amplifier apparatus 1, and the definition of the time width τ1=1/m×T of the slope of the ramp wave are substituted into Equation 1, K0 will be expressed by Equation 2.

$$K0 = (1/m \times T) \times |Vdd| \qquad \text{Eq. 2}$$

If Equation 2 is substituted into Equation 1, the time width τ of the ramp wave S8 will be expressed by Equation 3.

$$\tau = (|Vdd|/|Vt|) \times (1/m \times T) \qquad \text{Eq. 3}$$

Here, τ denotes the time width τ1≤τ≤τ2, T is the cycle, |Vt| is the target voltage |Vdd|≥|Vt|≥|2/n1×Vdd|.

Further, the slope α of the ramp wave S8 is expressed by Equation 4 using the time width τ of the ramp wave S8.

$$\alpha = (2 \times |Vcc|)/\tau \ (\alpha 1 \geq \alpha \geq \alpha 2) \qquad \text{Eq. 4}$$

Note that 2×|Vcc| is the power-supply voltage swing of the ramp wave S8.

Using the above-mentioned content, the ramp slope control unit 22 controls the slope α of the ramp wave S8 on the rising edge P1-P2 of the basic clock CL as a square wave input from the basic clock generating unit 21 to create a ramp wave S8 used for correcting the pulse width of the PWM signal S5.

The slope α of the created ramp wave S8 is controlled based on the principle to be described below so that it will be used in arithmetic processing performed by the correction unit. Thus, a change in amplification gain G due to variations in voltage values (+Vdd, −Vdd) of the source power of the power amplification unit 4 is canceled out.

Figure 3:
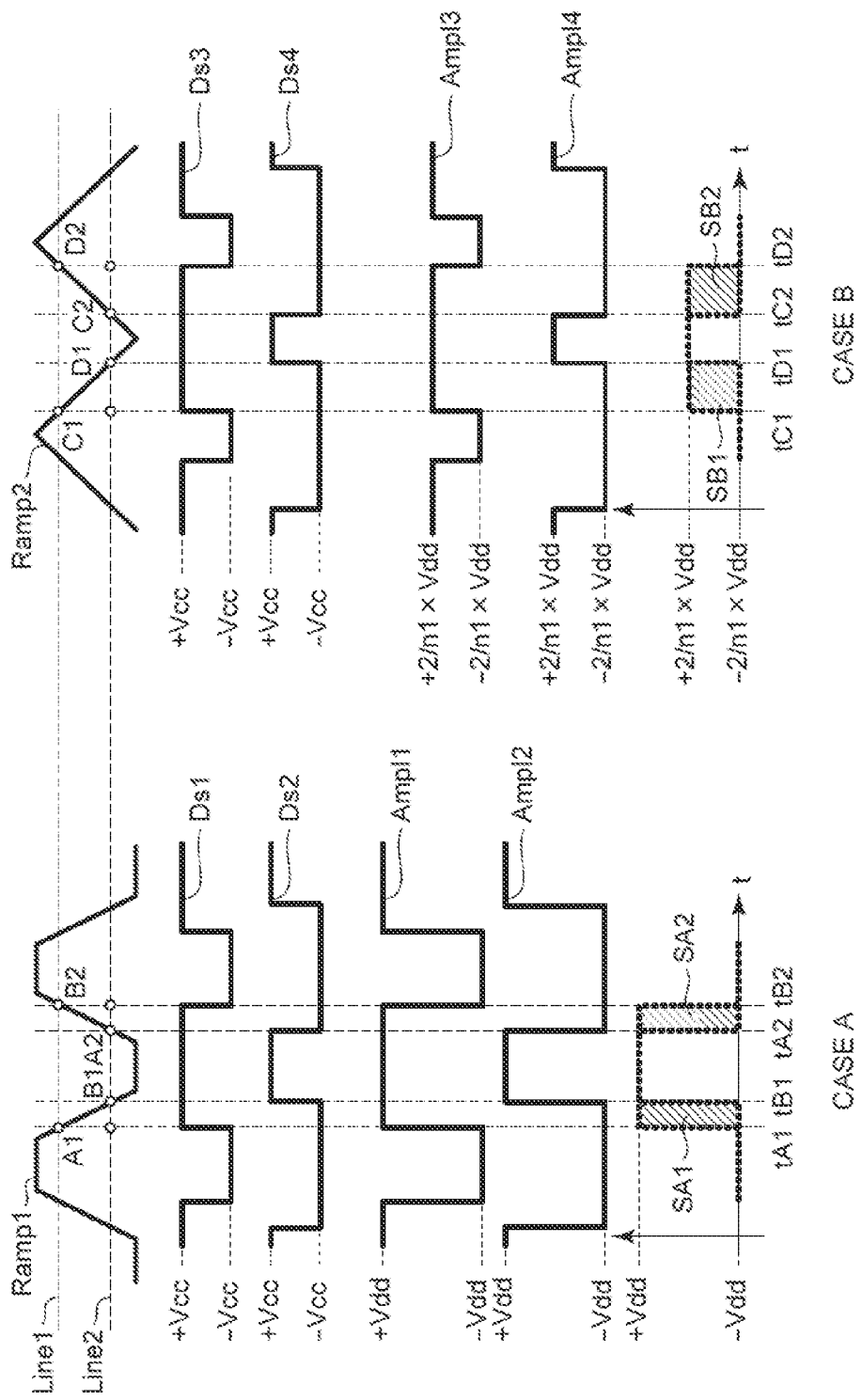
FIG. 3 It contains charts for describing the principle of controlling the slope of the ramp wave to cancel out a change in amplification gain due to variations in voltage values of source power of a power amplification unit in Embodiment 1 of the present invention.

Referring to FIG. 3, the principle of controlling the slope α of the ramp wave to cancel out the change in amplification gain due to the variations in voltage values (+Vdd, −Vdd) of the source power of the power amplification unit 4 will be described.

Assuming that the input audio signal S1 having the maximum amplitude level S1max is case A and that having the minimum amplitude level S1min is case B, the details of the cancellation principle will be described.

Case A is that the corrected PWM signal S2 corresponding to a ramp wave Ramp1 with the slope α1 of a ramp wave S8 is amplified by the supply of the source power with the voltage values ±Vdd(V) to the power amplification unit 4. Amplification gain Gain1 of the power amplification unit 4 in this case is |Vdd|/|Vcc|, and it is assumed that on time-width gain K1×(1/m×T) in the slope α1 of the ramp wave S8 controlled with time width τ1 is Gτ1.

Case B is that the corrected PWM signal S2 corresponding to a ramp wave Ramp2 with the slope α2 of the ramp wave is amplified by the supply of the source power with the voltage values ±2/n1×Vdd(V) to the power amplification unit 4.

Amplification gain Gain2 of the power amplification unit 4 in this case is |2/n1×Vdd|/|Vcc| (i.e., Gain2=2/n1×G1), and it is assumed that on time-width gain K1×n1/2×(1/m×T) in the slope α2 of the ramp wave S8 controlled with time width τ2 is Gτ2 (i.e., Gτ2=n1/2×Gτ1).

Here, Line1 and Line2 are defined as the maximum amplitude level S7max and the minimum amplitude level S7min of the differential integral signal S7 input from the integrator 24, respectively.

In case A, it is assumed that the corrected PWM signal S2 having the maximum on time-width tB2-tA1 in which Line1 corresponds to an interval B2-A1 larger than the ramp wave Ramp1 is denoted as Ds1, and the corrected PWM signal S2 having the minimum on time-width tA2-tB1 in which Line2 corresponds to an interval A2-B1 larger than the ramp wave Ramp1 is denoted as Ds2. In this case, a variable range (one way) of on time-width between Ds1 and Ds2 is expressed as tB1-tA1.

The variable range tB1-tA1 is expressed by Equation 5 using the time width τ1 of the ramp wave Ramp1 with the slope α1 of the ramp wave.

$$tB1-tA1 = K1 \times \tau 1 = K1 \times (|Vdd|/|Vdd|) \times (1/m \times T) \qquad \text{Eq. 5}$$

Here, K1 is a ratio of the amplitude (Line1-Line2) of the differential integral signal S7 to the amplitude (2×|Vcc|) of the ramp wave.

When the corrected PWM signals Ds1 and Ds2 are subjected to power amplification in the power amplification unit 4 to which the voltage values ±Vdd of source power were supplied, respectively, Ampl1 and Ampl2 are output from the power amplification unit 4 as corrected amplified signals S3, respectively.

Power output proportional to the on time-width of each of the amplified PWM signals Ampl1 and Ampl2 is calculated as a product of the time width tB1−tA1 and the voltage value 2×|Vdd| of the source power supplied to the power amplification unit 4. In other words, the power output is (tB1−tA1)× 2×|Vdd|. Assuming that the power output in this case is a power switching area SA1, SA1 is expressed by Equation 6.

$$SA1=(tB1-tA1)\times 2\times |Vdd| \qquad \text{Eq. 6}$$

If Equation 5 is substituted into Equation 6 to simplify the equation, the power switching area SA1 in the slope α1 of the ramp wave Ramp1 will be expressed by Equation 7.

$$SA1 = K1\times((|Vdd|/|Vdd|)\times(1/m\times T))\times 2\times |Vdd| = \qquad \text{Eq. 7}$$
$$K1\times(1/m\times T)\times 2\times |Vdd|$$

Here, since the rising and falling time widths τ are the same time width, it is obvious that SA1=SA2.

In case B, the slope α2 of the ramp wave Ramp2 is twice the slope α1 of the ramp wave Ramp1 in case A, and the voltage values ±2/n1×Vdd(V) of the source power supplied to the power amplification unit 4 is 2/n1 times the voltage values ±Vdd(V) of the source power supplied to the power amplification unit 4 in case A. The other conditions are the same as those in case A.

Therefore, using the same method as that in case A, a power switching area SB1 in case B is expressed by Equation 8.

$$SB1 = \qquad \text{Eq. 8}$$
$$K1\times((|Vdd|/|2/n1\times Vdd|)\times(1/m\times T))\times 2\times |2/n1\times Vdd| =$$
$$K1\times(n1/2\times(1/m\times T))\times 2\times |2/n1\times Vdd|$$

Here, like in case A, it is obvious that SB1=SB2. From a comparison between Equation 7 and Equation 8, it is found that the power switching area SA1 and the power switching area SB1 are the same.

If both sides of Equation 7 and Equation 8 are divided by 2×|Vcc| to simplify the equations, both will be expressed by Equation 9 and Equation 10, respectively.

$$SA1/(2\times|Vcc|) = K1\times(1/m\times T)\times(|Vdd|/|Vcc|) = G_T1\times \text{Gain1} \qquad \text{Eq. 9}$$

$$SB1/(2\times|Vcc|) = \qquad \text{Eq. 10}$$
$$K1\times(n1/2\times(1/m\times T))\times |2/n1\times Vdd/Vcc| = G_T2\times \text{Gain2}$$

Since the power switching area SA1 is the same as the power switching area SB1, a change (2/n1 times) in amplification gain caused by Gain2 falling below Gain1 is canceled out by a change (n1/2 times) in on time-width gain caused by Gτ2 exceeding Gτ1.

Further, the details of the cancellation principle when an arbitrary amplitude level (an amplitude level between case A of the maximum amplitude level and case B of the minimum amplitude level as mentioned above) of the input audio signal S1 is input from the audio device 8 into the amplifier apparatus 1 will be described.

The target voltage values ±Vt(V) corresponding to target set voltage value information Vs when the arbitrary amplitude level of the input audio signal S1 is input from the audio device 8 into the amplifier apparatus 1 is ±2/n×Vdd(V), and the range is $$\pm Vdd > \pm 2/n\times Vdd > \pm 2/n1\times Vdd (2<n<n1).$$

If the time width of the slope α of the ramp wave is denoted as τ, the time width τ will be $$\tau 1 < \tau < \tau 2.$$

Amplification gain G of the power amplification unit 4 in this case is $$|2/n\times Vdd|/|Vcc|.$$

Here, on time-width gain K1×n/2×(1/m×T) in the slope α of the ramp wave S8 controlled with the time width τ is denoted as Gτ.

In this case, when the control unit 72 outputs the target set voltage value information Vs to the voltage-variable power supply unit 73 and the ramp slope control unit, the voltage-variable power supply unit 73 supplies the target voltage values ±2/n×Vdd(V) as the voltage values of the source power of the power amplification unit 4 based on the target set voltage value information Vs.

Then, the ramp slope control unit 22 creates a ramp wave S8 whose time width of the slope α of the ramp wave corresponding to the target set voltage value information Vs is τ. Note that the slope α of the ramp wave S8 in this case is α1>α>α2.

Like in case A and case B, if the power switching area in this case is denoted as SA, the relationship between the amplification gain G of the power amplification unit 4 and the time width of the ramp wave in the slope α of the ramp wave will be expressed by Equation 11.

$$SA/(2\times Vcc) = K1\times T\times(2\times|2/n\times Vdd|)/(2\times|Vcc|) = \qquad \text{Eq. 11}$$
$$K1\times(n/2\times(1/m\times T))\times|2/n\times Vdd|/|Vcc| = G_T\times G$$

According to Equation 11, a change (2/n times) in amplification gain caused by G falling below Gain1 (amplification gain in the maximum amplitude level S1max of the input audio signal) is canceled out by a change (n/2 times) in on time-width gain caused by Gτ exceeding Gτ1.

It means that even in the arbitrary amplitude level of the input audio signal S1, a change in amplification gain caused by reducing the voltage values +Vdd and −Vdd of the source power to be supplied to the power amplification unit 4 is canceled out by a change in time width gain in the slope α of the ramp wave S8 controlled with the time width τ.

Here, the reason why loop gain is kept constant without changing the transfer function G(s) (frequency characteristics of gain and phase) of the amplifier apparatus 1 according to Embodiment 1 of the present invention will be described. The transfer function G(s) in the amplifier apparatus 1 is expressed by Equation 12.

$$G(s)=G0(s)/(1+G0(s)\beta(s)) \qquad \text{Eq. 12}$$

Note that β(s) is the transfer function of the negative feedback unit 6, G0(s) is an open-loop transfer function of the amplifier apparatus 1, and |G0(s)β(s)| is loop gain.

In this Embodiment 1, the open-loop transfer function G0(s) of the amplifier apparatus 1 can be determined by a product of transfer functions of respective circuits on an open loop path, i.e., a product of a transfer function G1(s) of the PWM converter 23, a transfer function G2(s) of the integrator 24, a transfer function G3(s) in the comparator 25 controlled by the slope α of the ramp wave, and a transfer function G4(s) of the power amplification unit 4, and expressed by Equation 13.

$$G0(s)=G1(s)\times G2(s)\times G3(s)\times G4(s) \qquad \text{Eq. 13}$$

Further, since the ramp slope control unit 22 proportionally changes the voltage value |Vt| of the source power supplied to the power amplification unit 4, and the time width τ of the ramp wave S8 in the slope α, i.e., it controls only the gain, no change occurs in the frequency characteristics of the phase between the transfer function G4(s) of the power amplification unit 4 and the transfer function G3(s) of the comparator 25.

As already mentioned, since the changes in gains G3(s) and G4(s) cancel out each other, the frequency characteristics of the gain G3(s)×G4(s) does not change. Further, since the other transfer functions G1(s) and G2(s) of the circuits in this Embodiment 1 do not change because of no influence on the control between the voltage values of the source power of the power amplification unit 4 and the slope α of the ramp wave input to the comparator 25, the open-loop transfer function G0(s) does not change.

According to the amplifier apparatus 1 in Embodiment 1 of the present invention, the transfer function G(s) does not change and the loop gain |G0(s)β(s)| can be kept constant.

Since the basic clock generating unit 21, the control unit 72, and the ramp slope control unit 22 can be implemented by digital signal processors, micro-controllers, or the like, there is no need to use a circuit, such as a conventional electronic volume, in the negative feedback unit 6, enabling reduction in circuit size. Further, the ramp slope control unit 22 outputs a ramp wave S8 after being subjected to arithmetic processing such as the lowpass filter to have linearity so that the time width τ of the ramp wave S8 can be controlled steplessly, causing no problem upon switching between time widths τ such as noise generation in the conventional techniques.

As described above, according to Embodiment 1 of the present invention, a ramp wave S8 is created by using the basic clock CL having the same cycle as the cycle of PWM conversion of the input audio signal S1 to control the voltage values +Vdd and −Vdd of the source power supplied to the power amplification unit 4 depending on the amplitude level of the input audio signal S1 input into the amplifier apparatus 1. Further, the slope α of this ramp wave S8 is controlled based on information on target set voltage values (target set voltage value information Vs) as voltage values to be output from the voltage-variable power supply unit 73 to compare the ramp wave S8 having the controlled slope α with the differential integral signal S7 so that the corrected PWM signal S2 with the corrected pulse width will be amplified in the power amplification unit 4.

Thus, since the slope α of the ramp wave S8 is so controlled that a change in amplification gain (gain of voltage amplification performed by the power amplification unit) due to variations in the voltage values +Vdd, −Vdd of the source power of the power amplification unit 4 can be canceled out, loop gain can be kept constant without changing the transfer function (frequency characteristics of gain and phase) of the amplifier apparatus 1, keeping the feedback circuit size small and preventing noise generation upon switching like in the conventional techniques.

Further, since loop gain does not decrease even if the voltage values +Vdd, −Vdd of the source power of the power amplification unit 4 are lowered depending on the amplitude level of the input audio signal S1, distortion in the output signal of the amplifier apparatus 1 can be reduced to prevent an increase in the noise superimposed on the output signal, thereby improving S/N.

Embodiment 2

Figure 4:
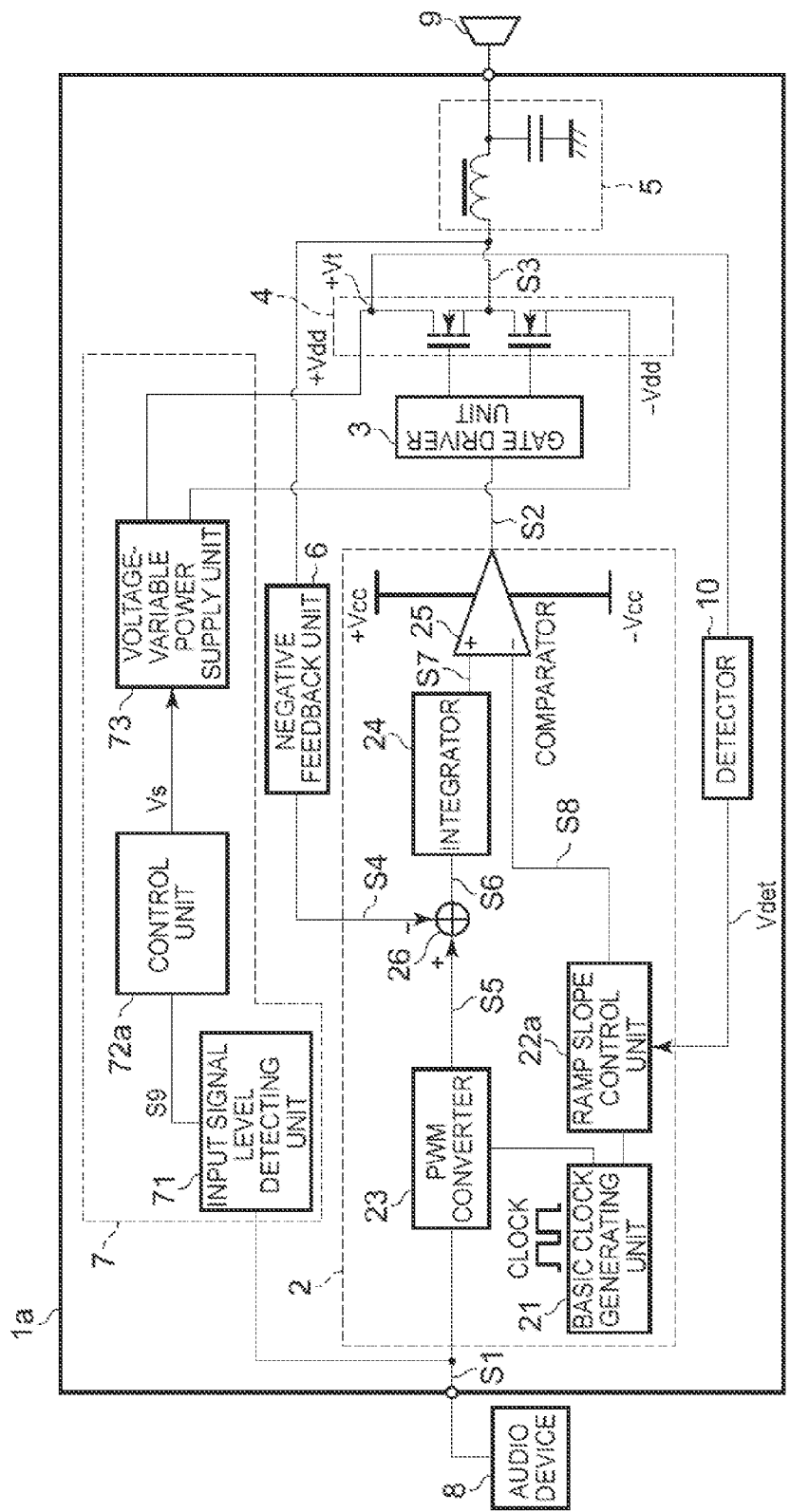
FIG. 4 It is a block diagram of an amplifier apparatus according to Embodiment 2 of the present invention.

An amplifier apparatus 1a according to Embodiment 2 of the present invention will be described below with reference to a block diagram of FIG. 4. Note that the following will describe only a point different from the amplifier apparatus 1 of FIG. 1 shown in Embodiment 1 of the present invention and description of the same structural portions will be omitted.

The amplifier apparatus 1a differs from the amplifier apparatus 1 in Embodiment 1 in that a detector 10 is included.

The detector 10 detects a power-supply voltage value +Vdd supplied to a power amplification unit stage 4, attenuates the detected voltage value +Vt at a predetermined ratio in a resistor dividing system, and outputs it to a ramp slope control unit 22a as information Vdet for controlling the slope α of the ramp wave S8.

This is to produce a similar effect to the amplifier apparatus 1 in which the control unit 72 outputs target set voltage value information Vs to the ramp slope control unit 22 as information for controlling the slope α of the ramp wave.

Figure 5:
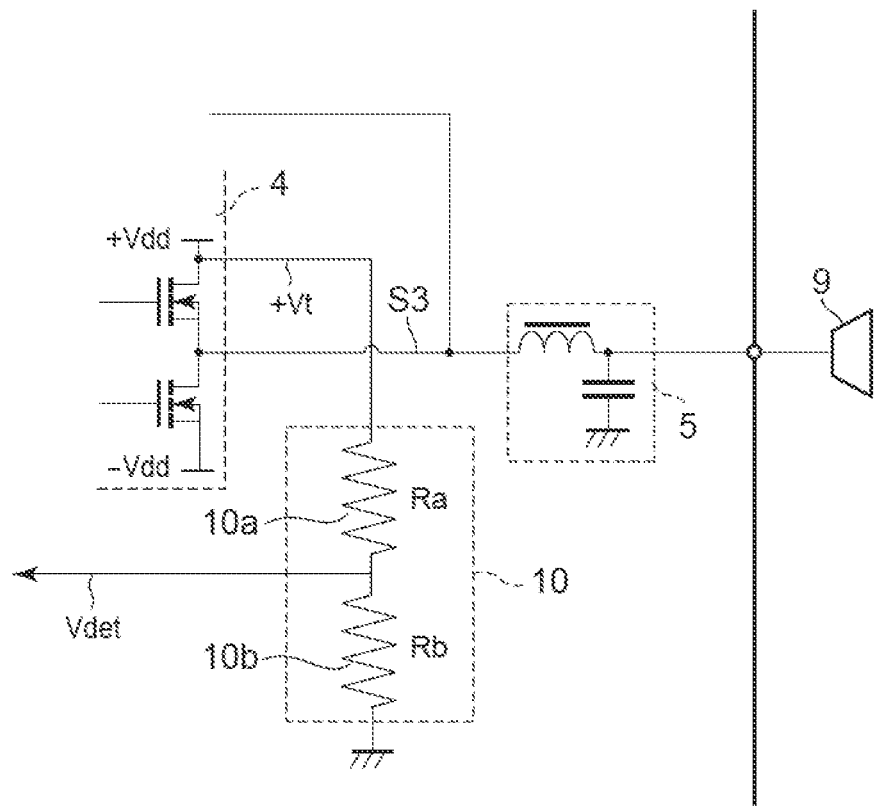
FIG. 5 It is a block diagram of a detector for detecting voltage values of the source power of the power amplification unit in Embodiment 2 of the present invention.

Here, the detailed structure of the detector 10 will be described with reference to a block diagram of FIG. 5.

The detector 10 is composed of a resistor 10a having a resistance value Ra and a resistor 10b having a resistance value Rb. One end of the resistor 10a is connected to the side of the positive power-supply voltage value +Vt(V) to be supplied from the voltage-variable power supply unit 73 to the power amplification unit 4, and the other end is connected in series to one end of the resistor 10b. One end of the resistor 10b is connected to the resistor 10a, and the other end is connected to the ground. A divided voltage value for the resistor 10a and the resistor 10b is created as |Vdet|(V), and output to the ramp slope control unit 22a. The divided voltage value |Vdet|(V) is expressed by Equation 14.

$$|Vdet|=Kb\times |Vt| \qquad \text{Eq. 14}$$

Here, Kb is Rb/(Ra+Rb).

The operation of the above amplifier apparatus 1a in Embodiment 2 of the present invention will be described. Note that description of the same operation as that in Embodiment 1 of the present invention will be omitted.

Like the control unit 72 in the amplifier apparatus 1, a control unit 72a in the amplifier apparatus 1a outputs target set voltage value information Vs to the voltage-variable power supply unit 73, but it does not output the target set voltage value information Vs to the ramp slope control unit 22a.

The detector 10 detects a positive-side power-supply voltage value +Vt supplied from the voltage-variable power supply unit 73 to the power amplification unit 4, attenuates it to a voltage value Vdet for controlling the slope a of the ramp wave according to Equation 14, and outputs it to the ramp slope control unit 22a.

The ramp slope control unit 22a uses the voltage value Vdet input from the detector 10 to create a ramp wave S8 with a variable slope α (the details of which will be described later) and output it to the comparator 25.

Referring next to the block diagram of FIG. 5, control of the slope α of the ramp wave S8 in Embodiment 2 will be described. Note that the following will describe only a point different from Embodiment 1 and description of the same portions will be omitted.

The ramp slope control unit 22a in the amplifier apparatus 1a uses the voltage value |Vdet|(V) output from the detector 10 as the information for controlling the slope α of the ramp wave to control a time width τ of the slope α of the ramp wave S8. A relationship between the voltage value |Vdet|(V) and the time width τ is expressed by Equation 15.

$$\tau=((Kb\times|Vdd|)/|Vdet|)\times(1/m\times T)(2<m) \qquad \text{Eq. 15}$$

Here, the range of time widths τ is the same as the range of time widths in the amplifier apparatus 1 (i.e., τ1≤τ≤τ2). Further, the relationship between |Vdet| and Kb is expressed by Equation 14.

The ramp slope control unit 22a uses the basic clock CL input from the basic clock generating unit 21 and the voltage value |Vdet|(V) input from the detector 10 to calculate a time width τ expressed by Equation 15 in order to create a ramp wave S8 with a slope α.

Equation 15 can be expressed as Equation 16.

$$\tau=((|Vdd|/(|Vdet|/Kb))\times(1/m\times T) \qquad \text{Eq. 16}$$

If Equation 14 is substituted into Equation 16 to simplify the equation, a relationship between the time width τ and the positive-side voltage value +Vt(V) is expressed by Equation 17.

$$\tau=(|Vdd|/|Vt|)\times(1/m\times T) \qquad \text{Eq. 17}$$

Here, since |Vt| is equal to the target voltage value corresponding to the target set voltage value information Vs in the amplifier apparatus 1, it is found from a comparison between Equation 17 and Equation 3 that the time width τ in the amplifier apparatus 1 is the same as the time width τ in the amplifier apparatus 1a. The slope α of the ramp wave S8 is controlled with this time width τ so that, like in the amplifier apparatus 1, a change in on time-width gain in the slope α of the ramp wave S8 controlled with the time width τ cancels out a change in amplification gain caused by lowering the power-supply voltage values |+Vdd|, |−Vdd| supplied to the power amplification unit 4 even in the amplifier apparatus 1a.

Further, like the results of study of the transfer function G(s) of the amplifier apparatus 1 in Embodiment 1 of the present invention, loop gain can also be kept constant without changing the transfer function Ga(s) of the amplifier apparatus 1a in Embodiment 2 of the present invention.

As described above, the amplifier apparatus 1a of Embodiment 2 of the present invention features that the slope α of the ramp wave S8 is controlled based on the voltage value |Vdet|(V) obtained by detecting the power-supply voltage value +Vdd supplied to the power amplification unit 4 and attenuating it at a predetermined ratio. Since the detector 10 directly detects the power-supply voltage value +Vdd of the power amplification unit 4, it has an advantage over Embodiment 1 in that a change in amplification gain due to variations in power-supply voltage values +Vdd, −Vdd of the power amplification unit 4 can be corrected.

Thus, like in Embodiment 1 of the present invention, since the slope a of the ramp wave is so controlled that the change in amplification gain (gain of voltage amplification performed by the power amplification unit) due to the variations in power-supply voltage values +Vdd, −Vdd of the power amplification unit 4 can be canceled out, loop gain can be kept constant without changing the transfer function (frequency characteristics of gain and phase) of the amplifier apparatus 1a, keeping the feedback circuit size small and preventing noise generation upon switching like in the conventional techniques.

Further, since loop gain does not decrease even if the power-supply voltage values |+Vdd|, |−Vdd| of the power amplification unit 4 are lowered depending on the amplitude level of the input audio signal S1, distortion in the output signal of the amplifier apparatus 1a can be reduced to prevent an increase in the noise superimposed on the output signal, improving S/N especially in the case of a small input audio signal.

Embodiment 3

Figure 6:
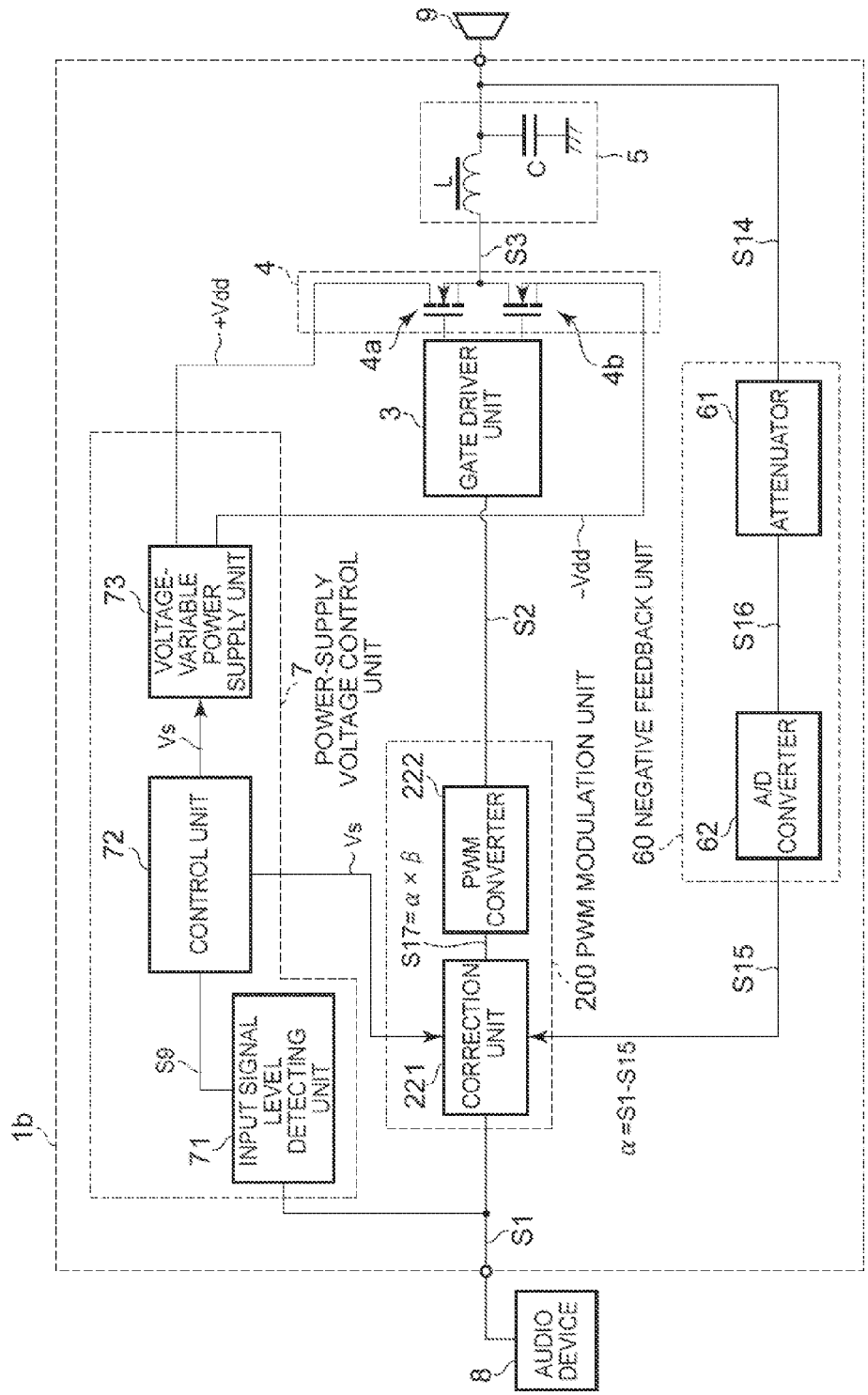
FIG. 6 It is a block diagram of an amplifier apparatus according to Embodiment 3 of the present invention.

An amplifier apparatus 1b according to Embodiment 3 of the present invention will be described with reference to a block diagram of FIG. 6. In FIG. 6, the amplifier apparatus 1b of Embodiment 3 is connected to an audio device 8 from which digital audio signals are output at line level. An audio signal output from the audio device 8 is input into the amplifier apparatus 1b as an input audio signal S1 of the amplifier apparatus 1b, subjected to power amplification in the amplifier apparatus 1b, and output to a speaker 9. The speaker 9 converts, to sound, the audio signal output from the amplifier apparatus after being subjected to power amplification, and emits the sound.

Further, the amplifier apparatus 1b and the audio device 8 are connected to a DC power supply (not shown) for supplying power required to activate them. Note that the power supply required to activate each apparatus/device is not limited to the DC power supply, and an AC power supply may also be used arbitrarily according to the characteristics of each apparatus/device.

The amplifier apparatus 1b is configured to include a PWM (Pulse Width Modulation) modulation unit 200, the gate driver unit 3, the power amplification unit 4, the LPF (lowpass filter) 5, a negative feedback unit 60, and the power-supply voltage control unit 7. Particularly, the negative feedback unit 60 is provided in the amplifier apparatus 1b to negatively feed an output signal of the LPF 5 back to the PWM modulation unit 200 in order to monitor a change in amplification gain of the power amplification unit 4. When the audio signal S1 is input from the audio device 8 to the amplifier apparatus 1b, the input audio signal S1 is input into the power-supply voltage control unit 7 and the PWM modulation unit 200.

In other words, monitoring means is a structure in which the negative feedback unit and the PWM modulation unit monitor target voltage information (Vs) and the feedback signal to process the signal at the output destination of the negative feedback unit.

The power-supply voltage control unit 7 detects an amplitude level S9 of the input audio signal S1 input from the audio device 8 in every sampling cycle T of the input audio signal S1, outputs target set voltage value information Vs corresponding to the detected amplitude level S9 of the input audio signal S1 to the PWM modulation unit 2, controls positive and negative output voltages (+Vdd, −Vdd) of the power amplification unit 4 so that they will be target voltages indicated by the target set voltage value information Vs, and sends source power with the positive-side and negative-side voltage values (+Vdd, −Vdd) to the power amplification unit 4.

The PWM modulation unit 200 calculates a difference value α (=S1−S15) between the input audio signal S1 input from the audio device 8 and a feedback signal S15 input from the negative feedback unit 60 in every sampling cycle T, then uses a correction coefficient β calculated from a predetermined calculation formula (the details of which will be described later) for the target set voltage value information Vs input from the power-supply voltage control unit 7 to calculate a PWM modulation target value S17 (=α×β) obtained by multiplying the difference value α by the correction coefficient β, and further compares the PWM modulation target value S17(=α×β) with a reference wave P (to be described later) to send the gate driver unit 3 a signal with a converted pulse width as a corrected PWM signal S2. The PWM modulation unit 200 can be implemented by a digital signal processor, a micro-controller, or the like.

The gate driver unit 3 inserts a dead-time into the corrected input PWM signal S2, creates a drive signal obtained by shifting the potential of the corrected PWM signal S2 to such a degree that the high-side (positive-side voltage value +Vdd) and low-side (negative-side voltage value −Vdd) high-speed switching elements 4a and 4b in the power amplification unit 4 can be driven, and sends the drive signal to the power amplification unit 4.

The power amplification unit 4 is configured as a half-bridge circuit consisting of the high-side high-speed switching element 4a arranged on a high-potential power supply side and supplied with the positive-side voltage +Vdd from the power-supply voltage control unit 7, and the low-side high-speed switching element 4b arranged on a low-potential power supply (or grounded) side and supplied with the negative-side voltage −Vdd from the power-supply voltage control unit 7. The power amplification unit 4 performs a high-speed switching operation with a voltage swing decided by the drive signal input from the gate driver unit 3 on the positive-side voltage +Vdd and the negative-side voltage −Vdd so that the drive signal input into the power amplification unit 4 will be subjected to power amplification to obtain an corrected AC amplified signal S3. The obtained corrected amplified signal S3 is sent to the LPF unit 5. Here, as the high-speed switching elements 4a and 4b, for example, MOS field-effect transistors or the like are used.

The LPF 5 is a filter for outputting, to the speaker 9, an analog audio signal S14 obtained by removing unnecessary high-frequency components from the corrected amplified signal S3 output from the power amplification unit 4. For example, the LPF 5 is composed of elements such as a coil L and a capacitor C. Further, the analog audio signal S14 output from the LPF 5 is output to the negative feedback unit 60 to monitor a change in amplification gain of the power amplification unit 4.

The negative feedback unit 60 is provided on a feedback circuit in which, after an attenuator 61 attenuates the analog audio signal S14 output from the LPF 5 at a predetermined ratio appropriate for the amplification gain of the power amplification unit 4, an A/D converter 62 converts the attenuated audio signal S16 to a digital value in every sampling cycle T and negatively feeds it back to the PWM modulation unit 200 as the feedback signal S15.

The detailed internal structure and operation of the power-supply voltage control unit 7 and the PWM modulation unit 200 will be described with reference to the block diagram of FIG. 6. The power-supply voltage control unit 7 is configured to include an input signal level detecting unit 71, a control unit 72, and a voltage-variable power supply unit 73. The input signal level detecting unit 71 creates input signal amplitude level information S9 including amplitude information on the input audio signal S1 input from the audio device 8, and sends it to the control unit 72. The control unit 72 selects, from data table information preset in the control unit 72, target set voltage value information Vs brought into one-to-one correspondence with the input signal amplitude level information S9 created by the input signal level detecting unit 71, and outputs the selected target set voltage value information Vs not only to the voltage-variable power supply unit 73 but also to the PWM modulation unit 200.

The target set voltage value information Vs is information indicative of values prestored in the control unit 72 as target voltage values to be set for the voltage-variable power supply unit 73 to reduce the power-supply voltage values (+Vdd, −Vdd) to an amplitude level that does not distort the amplified audio signal S14. The voltage-variable power supply unit 73 is a power supply for varying the output voltages (+Vdd, −Vdd) to voltage values to be set according to the target set voltage value information Vs input from the control unit 72, and supplying, to the power amplification unit 4, source power with voltage values (+Vdd, −Vdd) controlled to be voltage values indicated by the target set voltage value information Vs. The input signal level detecting unit 71 and the control unit 72 can be implemented by digital signal processors, micro-controllers, or the like.

The PWM modulation unit 200 is configured to include a correction unit 221 and a PWM converter 222. The correction unit 221 calculates an error α (=S1−S15) between the input audio signal S1 input from the audio device 8 and a feedback signal S15 input from the negative feedback unit 6 in every sampling cycle T, then uses a correction coefficient β calculated from a predetermined calculation formula for the target set voltage value information Vs input from the power-supply voltage control unit 7 to calculate a PWM modulation target value S17 (=α×β) obtained by multiplying the error α by the correction coefficient β, and outputs it to the PWM converter 222.

More specifically, the correction unit 221 uses the input audio signal S1 input from the audio device 8 and the feedback signal S15 input from the negative feedback unit 6 to subtract the feedback signal S15 from the input audio signal S1 in every sampling cycle T in order to determine an error value α (=S1−S15) between the input audio signal S1 and the feedback signal S15. The error value α is a value used to correct the PWM modulation target value S17. Further, the correction unit 221 uses the target set voltage value information Vs input from the control unit 72 to calculate, from the predetermined calculation formula, the correction coefficient β brought into one-to-one correspondence with the target set voltage value information Vs, multiplies the error value α by this correction coefficient β, and outputs it to the PWM converter 222 as the PWM modulation target value S17 (=α×β). The correction coefficient β is a value determined in the correction unit 221 from the predetermined calculation formula to cancel out a change in amplification gain due to variations in the voltage values (+Vdd, −Vdd) of source power of the power amplification unit 4 (the details of which will be described later).

The PWM converter 222 compares the PWM modulation target value S17 input from the correction unit 221 with a reference wave P, creates a corrected PWM signal S2 having a pulse width and repeating ON and OFF in time periods with a predetermined sampling time width T, and outputs it to the gate driver unit 3. As a PWM generation method, a delta-sigma conversion method and a triangular wave comparison method are known. In this embodiment, either of these methods is applied.

Figure 7:
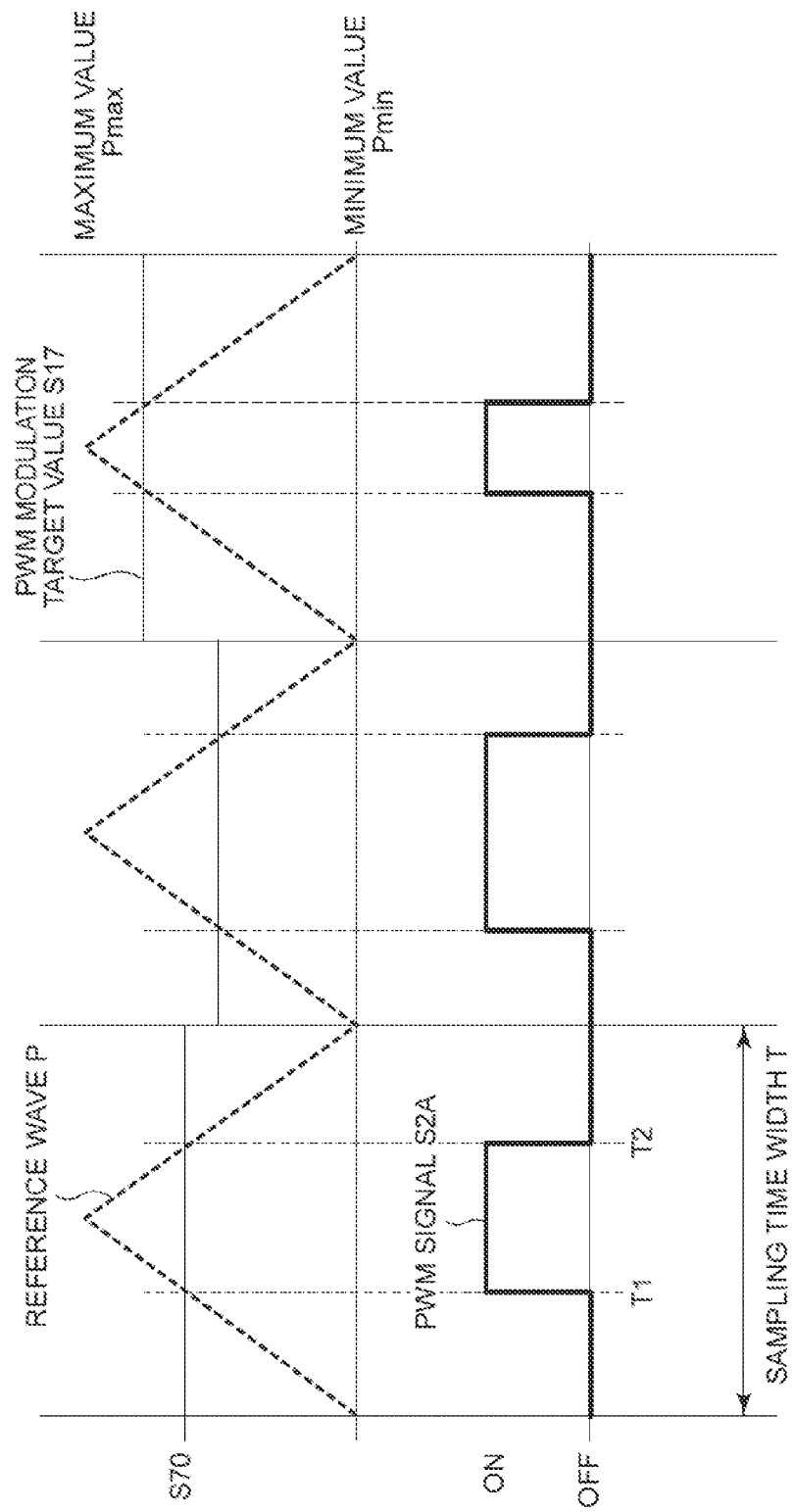
FIG. 7 It is an explanatory chart showing a relationship between the PWM modulation target value of a PWM converter and the PWM signal in Embodiment 3 of the present invention.

Here, an example of the method of generating the corrected PWM signal S2 from the PWM modulation target value S17 using the triangular wave comparison method will be described with reference to FIG. 7. The PWM converter 222 compares the PWM modulation target value S17 input to every predetermined sampling time width T with the reference wave P. As shown in FIG. 7, the reference wave P is a triangular wave that transits from the minimum value Pmin to the maximum value Pmax, and then to the minimum value Pmin again in tune with the time period with the predetermined sampling time width T. The minimum value Pmin is a value at which the pulse width of the corrected PWM signal S2 after being subjected to pulse width conversion is equivalent to 100%, and the maximum value Pmax is a value at which the pulse width of the corrected PWM signal S2 after being subjected to pulse width conversion is equivalent to 0%. In other words, the PWM modulation target value S17 is a value varying in a range between the maximum value Pmax and the minimum value Pmin of the reference wave P.

During a time period with the predetermined sampling time width T, the PWM modulation target value S17 is subtracted from the reference wave P. In this case, when the time period is a period during which the subtracted value (=P−S17) is positive, the output of the corrected PWM signal S2 is ON, while when the time period is a period during which the subtracted value (=P−S17) is negative, the output of the corrected PWM signal S2 is OFF. As shown in FIG. 7, the period during which a subtracted value (=P−S70) obtained by subtracting S70 as an example of the PWM modulation target value S17 from the reference wave P is positive is from time point T1 to time point T2, and ON is output as the corrected PWM signal S2 during this period. Thus, a corrected PWM signal S2 having ON and OFF pulse widths corresponding to the PWM modulation target value S17 in the predetermined sampling time width T is generated. When the value S17 is small, the pulse width of the corrected PWM signal S2 becomes large, while when the value S17 is large, the pulse width of the corrected PWM signal S2 becomes small.

Referring next to FIG. 8, the details of the principle of controlling the PWM modulation target value S17 to a change in amplification gain due to variations in the voltage values (+Vdd, −Vdd) of the source power of the power amplification unit 4 will be described. Here, an amplified signal S3A (and a corrected amplified signal S3) is actually an AC signal, but it is shown as a DC signal (only on the +Vdd side) for the sake of simplifying the description. As shown in FIG. 8(*a*), description will be made by taking, as an example, a case where the power-supply voltage value +Vdd (the output level of the corrected amplified signal S3) indicated by the target set voltage value information Vs transits from voltage V1 to voltage V2 (>V1) based on a change in the input signal amplitude level information 89. The two voltage values V1 and V2 of the source power of the power amplification unit 4 are generated as respective amplitudes of the amplified signal S3A, resulting in an increase in the amplitude of the amplified signal S3A from V1 to V2.

As shown in FIG. 8(*a*), when the amplitude of the amplified signal S3A is V2, electric power energy of the amplified signal S3A is greater that the case where the amplitude is V1 by an amount corresponding to area C1 (=(V2−V1)×(T4−T3)). In other words, if the amplitude of the amplified signal S3A is increased from V1 to V2 as shown in FIG. 8(*b*), there will occur a change to increase the amplification gain of the power amplification unit 4 by an amount corresponding to area C2 (=V2×(T1−T3)) and area C3 (=V2×(T4−T2)).

Therefore, in order to cancel out the change in amplification gain due to variations in the voltage values of the source power of the power amplification unit 4, as shown in FIG. 8(*b*), the correction unit 221 calculates a value α1 as the difference value α between the input audio signal S1 and the feedback signal S15 input from the negative feedback unit 6, calculates, from a calculation formula, a value β1 as the correction coefficient β brought into one-to-one correspondence with the input target voltage value information Vs, and sends the PWM converter 222 a value S71 (=α1×β1) calculated by multiplying the difference value α1 by the correction coefficient β1 as the PWM modulation target value S17.

Then, the PWM converter 222 compares this value S71 with the reference wave P and performs pulse width conversion to generate a corrected PWM signal S2.

An equation for calculating the correction coefficient β1 is determined as follows: Here, description is made with reference to FIG. 8 by taking, as an example, a case where the reference wave P is of the shape of an isosceles right triangle. As shown in FIG. 8(*a*) and FIG. 8(*b*), a conditional equation in which the change in area (=C2+C3) becomes equal to area C1 is expressed as $$(V2 - V1) \times (T4 - T3) = V2((T1 - T3) + (T4 - T2)).$$

Further, respective relation expressions between the corrected PWM modulation target value S71 and pulse widths (T3 to T4) and (T1 to T4) are expressed as $$T1 - T3 = T4 - T2, \text{ and}$$

$$T - T4 = T3, \text{ and}$$

$$T1 = \alpha1 \times \beta1, \text{ and}$$

$$T3 = \alpha1.$$

When the above-mentioned conditional equation and relational expressions are simplified, the following equation is determined:

$$\beta1 = ((V2 - V1) \times T + 2V1 \cdot \alpha1)/2V2 \cdot \alpha1.$$

Thus, β1 is determined from the predetermined sampling time width T, the voltage values V2 and V1 of the source power, and the difference value α1 when the voltage value of the source power is V1. Even when the reference wave P is of any shape other than the isosceles right triangle, the relationship between the ordinate and the abscissa is easily determined from the Pythagoras' theorem.

As a result, the ON pulse width of the corrected PWM signal S2 is reduced from (T4−T3) to (T2−T1)(<(T4−T3)) as shown in FIG. 8(*b*), and electric power energy of the corrected amplified signal S3 amplified based on this corrected PWM signal S2 is reduced by an amount corresponding to the sum of area C2(=V2×(T1−T3)) and area C3(=V2×(T4−T2)) shown in FIG. 8(*b*). In other words, since the ON pulse width of the corrected PWM signal S2 is reduced like the corrected PWM signal S2, the amplification gain of the power amplification unit 4 is reduced.

In the meantime, the value β1 as the correction coefficient β is determined from the above-mentioned calculation formula to generate ON and OFF pulse widths of the corrected PWM signal S2 so that area C1 will become equal to the sum of area C2 and area C3, i.e., C1=C2+C3. In other words, since the pulse width conversion is performed by using the PWM modulation target value S17 calculated by multiplying the difference value α by the correction coefficient β, an increase or decrease in the amplification gain of the power amplification unit 4 can be canceled out.

Here, the reason why loop gain is kept constant without changing the transfer function G(s) (frequency characteristics of gain and phase) of the amplifier apparatus 1*b* according to Embodiment 3 of the present invention will be described. The transfer function G(s) in the amplifier apparatus 1*b* is expressed by Equation 18.

$$G(s) = G0(s)/(1 + G0(s)B(s)) \quad \text{Eq. 18}$$

where B(s) denotes the transfer function of the negative feedback unit 60, G0(s) is the open-loop transfer function of the amplifier apparatus 1b, and |G0(s)B(s)| is loop gain.

In this Embodiment 3, the open-loop transfer function G0(s) of the amplifier apparatus 1b is determined as a product of the transfer functions of respective circuits in the open loop path, i.e., as a product of the transfer function G1(s) of the PWM modulation unit 2, the transfer function G2(s) of the power amplification unit 4, and the transfer function G3(s) of the LPF 5, and can be expressed by Equation 19.

$$G0(s)=G1(s)\times G2(s)\times G3(s) \quad \text{Eq. 19}$$

As for a change (=C2+C3) in amplification gain due to increases or decreases in the voltage values (+Vdd, −Vdd) of the source power supplied to the power amplification unit 4, since the PWM modulation unit 200 controls the ON and OFF pulse widths of the corrected PWM signal S2 using the PWM modulation target value S17 to cancel out the change (=C2+C3) in amplification gain, i.e., only the gain, there occurs no change in the frequency characteristics of phase among the transfer function G1(s) of the PWM modulation unit 200, the transfer function G2(s) of the power amplification unit 4, and the transfer function G3(s) of the LPF 5. Thus, the open-loop transfer function G0(s) does not change. According to the amplifier apparatus 1b in Embodiment 3 of the present invention, the transfer function G(s) does not change and the loop gain |G0(s)B(s)| can be kept constant.

Since the control unit 72 and the PWM modulation unit 200 can be implemented by digital signal processors, micro-controllers, or the like, there is no need to use a circuit such as an electronic volume control circuit in the negative feedback unit 60 like in the conventional techniques, so that the circuit size can be reduced and there arises no problem upon switching such as noise generation in the conventional techniques.

As described above, according to Embodiment 3 of the present invention, when the voltage values (+Vdd, −Vdd) of the source power to be supplied to the power amplification unit 4 is controlled according to the amplitude level S9 of the input audio signal S1 input into the amplifier apparatus 1b, the PWM modulation target value S17 of the PWM converter 222 in the PWM modulation unit 200 is controlled based on the target set voltage value information Vs to correct the original PWM signal S2A based on the PWM modulation target value S17 and output the corrected PWM signal S2 so that it will be amplified in the power amplification unit 4.

Thus, since the PWM modulation target value S17 of the PWM converter 222 in the PWM modulation unit 200 is so controlled that a change (=C2+C3) in amplification gain (gain of voltage amplification performed by the power amplification unit 4) due to variations in the voltage values (+Vdd, −Vdd) of the source power of the power amplification unit 4 can be canceled out, loop gain can be kept constant without changing the transfer function (frequency characteristics of gain and phase) of the amplifier apparatus 1b, keeping the feedback circuit size small and preventing noise generation upon switching like in the conventional techniques. Further, since loop gain does not decrease even if the voltage values (+Vdd, −Vdd) of the source power of the power amplification unit 4 is lowered depending on the amplitude level 89 of the input audio signal S1, distortion in the output signal of the amplifier apparatus 1b can be reduced to prevent an increase in the noise superimposed on the output signal, thereby improving the S/N ratio.

INDUSTRIAL APPLICABILITY

The present invention can reduce noise superimposed on an output signal while keeping loop gain constant without an increase in circuit size and a change in the transfer function (frequency characteristics of gain and phase) of the amplifier apparatus. In particular, the present invention has the effect of improving the S/N ratio of a small input audio signal, and is applicable to the fields of design and production of audio amplifier apparatuses.

The invention claimed is:

1. An amplifier apparatus comprising:
   a power amplification unit for amplifying a power of an input audio signal by switching a power supply voltage using a pulse width modulation signal appropriate for a level of the input audio signal;
   a power-supply voltage control unit for detecting an amplitude level of the input audio signal and applying a target set voltage appropriate for the detected amplitude level of the input signal to the power amplification unit as the power supply voltage;
   means for monitoring output of the power amplification unit;
   a pulse width conversion unit for converting the input audio signal to a pulse width modulation signal with a pulse width appropriate for the level; and
   a pulse width correction unit for correcting the pulse width of the pulse width modulation signal generated by the pulse width conversion unit based on the target set voltage and the monitored output of the power amplification unit to cancel out a change in amplification gain of the power amplification unit, and applying the corrected pulse width modulation signal to the power amplification unit.

2. The amplifier apparatus according to claim 1, characterized in that the pulse width correction unit includes:
   a basic clock generating unit for generating a basic clock as a basic timing signal upon conversion of the input audio signal to the pulse width modulation signal;
   a ramp slope control unit for generating a ramp wave different in slope according to the target set voltage from the basic clock generated by the basic clock generating unit; and
   a correction unit for correcting the pulse width of the pulse width modulation signal generated by the pulse width conversion unit based on the ramp wave generated by the ramp slope control unit and the monitored output of the power amplification unit.

3. An amplifier apparatus comprising:
   a power amplification unit for amplifying a power of an input audio signal by switching a power supply voltage using a pulse width modulation signal appropriate for a level of the input audio signal;
   a power-supply voltage control unit for detecting an amplitude level of the input audio signal and applying a target set voltage appropriate for the detected amplitude level of the input signal to the power amplification unit as the power supply voltage;
   a detection unit for detecting the power supply voltage to be applied to the power amplification unit;
   a pulse width conversion unit for converting the input audio signal to a pulse width modulation signal with a pulse width appropriate for the level;
   a basic clock generating unit for generating a basic clock as a basic timing signal upon conversion of the input audio signal to the pulse width modulation signal;
   a ramp slope control unit for generating a ramp wave different in slope according to the detected power supply voltage from the basic clock generated by the basic clock generating unit;

means for monitoring output of the power amplification unit; and a correction unit for correcting the pulse width of the pulse width modulation signal generated by the pulse width conversion unit based on the ramp wave generated by the ramp slope control unit and the monitored output of the power amplification unit to cancel out a change in amplification gain of the power amplification unit, and applying the corrected pulse width modulation signal to the power amplification unit.

4. An amplifier apparatus comprising:

a power amplification unit for amplifying a power of an input audio signal by switching a power supply voltage using a pulse width modulation signal appropriate for a level of the input audio signal;

a power-supply voltage control unit for detecting an amplitude level of the input audio signal and applying a target set voltage appropriate for the detected amplitude level of the input signal to the power amplification unit as the power supply voltage;

means for monitoring a change in amplification gain of the power amplification unit; and a pulse width conversion unit for correcting a pulse width of the pulse width modulation signal by correcting a level of the input audio signal to be subjected to pulse width modulation according to the target set voltage so that the monitored change in amplification gain of the power amplification unit will be canceled out; and applying the corrected pulse width modulation signal to the power amplification unit.

5. The amplifier apparatus according to claim 4, characterized in that the pulse width conversion unit calculates a difference value between the amplitude level of the input audio signal and a monitored level obtained by attenuating the output of the power amplification unit, and multiplies the calculated difference value by a correction coefficient appropriate for the target set voltage to correct the level of the input audio signal to be subjected to pulse width modulation.

6. The amplifier apparatus according to claim 5, characterized in that the pulse width conversion unit further compares the corrected level of the input audio signal to be subjected to pulse width modulation with a predetermined reference wave to generate the pulse width modulation signal.

\* \* \* \* \*